United States Patent
An et al.

(10) Patent No.: US 12,369,286 B2
(45) Date of Patent: Jul. 22, 2025

(54) ADAPTIVE TEMPERATURE CONTROL METHOD BASED ON LOG ANALYSIS OF CHASSIS MANAGER IN EDGE SERVER

(71) Applicant: Korea Electronics Technology Institute, Seongnam-si (KR)

(72) Inventors: Jae Hoon An, Incheon (KR); Young Hwan Kim, Yongin-si (KR)

(73) Assignee: Korea Electronics Technology Institute, Seongnam-si (KR)

( * ) Notice: Subject to any disclaimer, the term of this patent is extended or adjusted under 35 U.S.C. 154(b) by 375 days.

(21) Appl. No.: 17/986,130

(22) Filed: Nov. 14, 2022

(65) Prior Publication Data

US 2023/0156976 A1 May 18, 2023

(30) Foreign Application Priority Data

Nov. 15, 2021 (KR) .................. 10-2021-0156263

(51) Int. Cl.
H05K 7/20 (2006.01)

(52) U.S. Cl.
CPC ..... *H05K 7/20836* (2013.01); *H05K 7/20718* (2013.01)

(58) Field of Classification Search
CPC .................................. H05K 7/20836
See application file for complete search history.

(56) References Cited

U.S. PATENT DOCUMENTS

| | | | | |
|---|---|---|---|---|
| 9,506,821 | B1 * | 11/2016 | Robillard | G01K 7/427 |
| 11,147,186 | B2 * | 10/2021 | North | H05K 7/20209 |
| 2006/0248360 | A1 * | 11/2006 | Fung | G06F 1/3296 |
| | | | | 713/300 |
| 2013/0178999 | A1 * | 7/2013 | Geissler | G06F 9/5094 |
| | | | | 700/299 |

(Continued)

FOREIGN PATENT DOCUMENTS

| | | | |
|---|---|---|---|
| CN | 111562803 A | * | 8/2020 |
| KR | 10-2021-0051454 A | | 5/2021 |

OTHER PUBLICATIONS

Korean Office Action issued on Nov. 24, 2023, in counterpart Korean Patent Application No. 10-2021-0156263 (4 pages in English, 5 pages in Korean).

(Continued)

*Primary Examiner* — Suresh Suryawanshi
(74) *Attorney, Agent, or Firm* — NSIP Law

(57) ABSTRACT

There is provided an adaptive temperature control method based on log analysis of a chassis manager in an edge server. The adaptive temperature control method of the edge server system according to an embodiment includes: collecting, by a chassis manger module of the edge server system, work logs of a computing module and a storage module; predicting a future work load from the collected work logs; predicting a future internal temperature of the edge server system, based on the work load and a future temperature; and controlling, by the chassis manager module, the edge server system, based on the predicted future internal tem- (Continued)

perature. Accordingly, a configuration module of an edge server system may be managed/controlled in a rugged environment, and temperature of the edge server system may be adaptively controlled by transferring or additionally generating works of an edge server.

19 Claims, 6 Drawing Sheets

(56) References Cited

U.S. PATENT DOCUMENTS

| | | | |
|---|---|---|---|
| 2013/0197895 A1* | 8/2013 | Wang | G06F 1/3203 |
| | | | 703/21 |
| 2016/0011607 A1 | 1/2016 | James et al. | |
| 2016/0349810 A1 | 12/2016 | Chainer et al. | |

OTHER PUBLICATIONS

Korean Office Action issued on May 22, 2023, in counterpart Korean Patent Application No. 10-2021-0156263 (4 pages in English, 5 pages in Korean).

* cited by examiner

| Chassis Manager UI/UX | | | | | | | |
|---|---|---|---|---|---|---|---|
| | | | | | | | Summary information |
| Home | CMM | Moudule1 | Moudule2 | | | | |
| Account | | | | System Fan | | | |
| Chassis Manager | | | | Memory/CPU | | | |
| Server State | | | | | | | |
| Monitoring | CMM | Moudule1 | Moudule2 | | | | Monitoring |
| Maintenance | SENSOR | | | EVENT | | | |
| | Temperature Sensor 1 : 50 | | | 2021-04-08 | 11:31:28 | PEB_ADC_12_AUX | Voltage |
| | Temperature Sensor 2 : 30 | | | 2021-04-08 | 11:33:56 | PEB_ADC_12_ABC | Voltage |
| Update Service | other Sensor 4 : 50 | | | 2021-04-08 | 11:35:32 | PEB_P1V0_CPU0 | Voltage |
| | humidity Sensor 1 : 50 | | | 2021-04-08 | 11:37:11 | PEB_ADC_12_AUX | Voltage |
| Log Service | | | | 2021-04-08 | 11:39:33 | PEB_P1V0_CPU1 | Voltage |
| | Network | | | | Power | | |
| | CMM | Moudule1 | Moudule2 | | CMM | Moudule1 | Moudule2 |
| | LAN#1 | LAN#2 | LAN#3 | | Power Module#1 | | Power Module#2 |

FIG. 2

ADAPTIVE TEMPERATURE CONTROL METHOD BASED ON LOG ANALYSIS OF CHASSIS MANAGER IN EDGE SERVER

CROSS-REFERENCE TO RELATED APPLICATION(S) AND CLAIM OF PRIORITY

This application is based on and claims priority under 35 U.S.C. § 119 to Korean Patent Application No. 10-2021-0156263, filed on Nov. 15, 2021, in the Korean Intellectual Property Office, the disclosure of which is herein incorporated by reference in its entirety.

BACKGROUND

Field

The disclosure relates to edge server management and control technology, and more particularly, to a method for effectively managing and controlling resources of an edge server operating in a rugged environment.

Description of Related Art

In a rugged environment, information technology (IT) equipment is difficult to operate normally, and management and control thereof are more necessary. However, current technology for overcoming the rugged environment only focuses on a hardware-level approach for reinforcing/supplementing an exterior of IT equipment.

However, abnormal climate conditions which are becoming more serious recently make it more difficult to respond with only the above-described approach. Accordingly, there is a need for a method for responding to a rugged environment from a different viewpoint.

In addition, management and control of equipment by using the above-described technology should fit for general purpose, and should follow industrial standards.

SUMMARY

To address the above-discussed deficiencies of the prior art, it is a primary object of the disclosure to provide an adaptive temperature control method based on log analysis of an edge server, as a solution for enabling management of an edge service even in a rugged environment.

Another object of the disclosure is to provide a structure which is capable of applying a module for managing/controlling an edge server in a rugged environment to an edge server system as an application programming interface (API) interface (I/F) based on Redfish standards.

According to an embodiment of the disclosure to achieve the above-described objects, an adaptive temperature control method of an edge server system includes: collecting, by a chassis manger module of the edge server system, work logs of a computing module and a storage module; predicting, by the chassis manager module, a future work load from the collected work logs; identifying, by the chassis manager module, a future temperature; predicting, by the chassis manager module, a future internal temperature of the edge server system, based on the predicted work load and the identified future temperature; and controlling, by the chassis manager module, the edge server system, based on the predicted future internal temperature.

Controlling may include, when the future internal temperature is predicted to be higher than or equal to a first temperature, controlling, by the chassis manager module, a fan module.

Controlling may further include, when the future internal temperature is predicted to be higher than or equal to a second temperature which is higher than the first temperature, requesting, by the chassis manager module, transferring some works of the computing module to another edge server system.

Controlling may further include: when the future internal temperature is predicted to be higher than or equal to a third temperature which is higher than the second temperature, requesting, by the chassis manager module, transferring all of the works of the computing module to another edge server system; and controlling, by the chassis manager module, a power module to terminate the edge server system.

Controlling may include, when the future internal temperature is predicted to be lower than or equal to a fourth temperature, controlling, by the chassis manager module, a heater module.

Controlling may further include, when the future internal temperature is predicted to be lower than or equal to a fifth temperature which is lower than the fourth temperature, requesting, by the chassis manager module, transferring some works of another edge server system to the computing module.

Controlling may further include, when the transfer request is not accepted, generating, by the chassis manager module, an additional work for the computing module.

Controlling may further include: when the future internal temperature is predicted to be lower than or equal to a sixth temperature which is lower than the fifth temperature, requesting, by the chassis manager module, transferring all of the works of the computing module to another edge server system; and controlling, by the chassis manager module, a power module to terminate the edge server system.

Controlling may further include: when a request to transfer a work is received from another edge server system, predicting, by the chassis manager module, a change in the future internal temperature of the edge server system caused by transfer of the work; and determining whether to accept the transfer of the work, based on the predicted change in the future internal temperature.

According to another embodiment of the disclosure, an edge server system includes: a computing module and a storage module configured to perform works for an edge service; a fan module configured to reduce an internal temperature of the edge server system; a heater module configured to increase the internal temperature of the edge server system; and a chassis manager module configured to collect work logs of the computing module and the storage module, to predict a future work load from the collected work logs, to identify a future temperature, to predict a future internal temperature of the edge server system, based on the predicted work load and the identified future temperature, and to control the fan module and the heater module, based on the predicted future internal temperature.

According to another embodiment of the disclosure, an adaptive temperature control method of an edge server system includes: predicting, by a chassis manager module of the edge server system installed in a rugged environment, a future internal temperature of the edge server system; and controlling, by the chassis manager module, the edge server system, based on the predicted future internal temperature.

According to another embodiment of the disclosure, an edge server system installed in a rugged environment includes: a computing module and a storage module configured to perform a work for an edge service; a fan module configured to reduce an internal temperature of the edge server system; a heater module configured to increase the internal temperature of the edge server system; and a chassis manager module configured to predict a future internal temperature of the edge server system, and to control the fan module and the heater module based on the predicted future internal temperature.

According to embodiments of the disclosure as described above, in a rugged environment, a configuration module (a computing module, a storage module, a fan, a heater) of an edge server system may be managed/controlled, and temperature of the edge server system may be adaptively controlled by transferring or additionally generating works of an edge server.

In addition, according to embodiments of the disclosure, in a rugged environment, a module for managing/controlling an edger server may be applied to an edge server system based on Redfish standards, and accordingly, management and control of the edge server may fit for general purpose and may follow industrial standards.

Other aspects, advantages, and salient features of the invention will become apparent to those skilled in the art from the following detailed description, which, taken in conjunction with the annexed drawings, discloses exemplary embodiments of the invention.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts:

FIG. 2 is a view illustrating an example of a user interface (UI)/user experience (UX) screen for management provided in a client for external management;

DETAILED DESCRIPTION

Hereinafter, the disclosure will be described in detail with reference to the accompanying drawings.

An embodiment of the disclosure provides a method and a module for managing/controlling an edge server system in a rugged environment.

Specifically, an embodiment of the disclosure provides not only a method for predicting and controlling an internal temperature of an edge server so as to provide an edge service normally while protecting an edge server system in a rugged environment, but also a method for controlling work transfer of the edge server.

Figure 1:
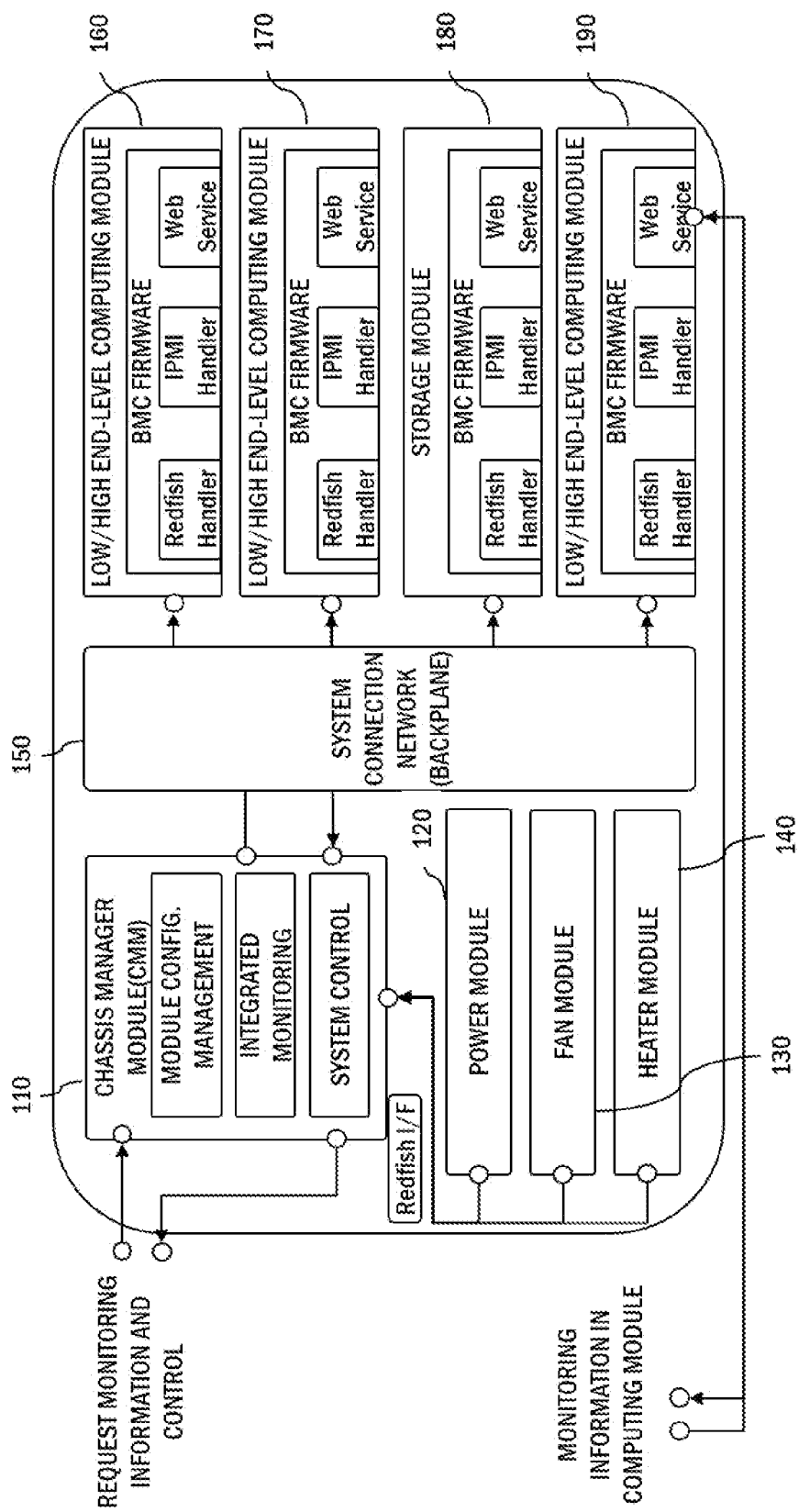
FIG. 1 is a view illustrating a configuration of an edge server system according to an embodiment of the disclosure.

FIG. 1 is a view illustrating a configuration of an edge server system according to an embodiment of the disclosure. The edge server system according to an embodiment may include a chassis manager module 110, a power module 120, a fan module 130, a heater module 140, a system connection network 150, computing modules 160, 170, 190, and a storage module 180 as shown in the drawing.

The power module 120 is a module for supplying necessary power to internal configuration modules 110, 130, 140, 150, 160, 170, 180, 190 of the edge server system. The fan module 130 is a module for reducing an internal temperature of the edge server system, and the heater module 140 is a module for increasing an internal temperature of the edge server system.

The system connection network 150 connects the internal configuration modules 110, 120, 130, 140, 160, 170, 180, 190 with one another to enable communication and control. A Redfish I/F may be applied as an interface for connecting/managing/controlling between the internal configuration modules 110, 120, 130, 140, 150, 160, 170, 180, 190 of the edge server system.

The computing modules 160, 170, 190 performs works necessary for providing an edge service, and the storage module 180 provides a storage space necessary for works.

The chassis manager module 110 manages configurations of the internal modules 120, 130, 140, 150, 160, 170, 180, 190 of the edge server system, monitors work loads of the computing module 160, 170, 190 and the storage module 180, and controls the internal modules 120, 130, 140, 150, 160, 170, 180, 190 of the edge server system, based on the result of monitoring.

A client for external management may request monitoring information through the chassis manager module 110, and may request control. FIG. 2 illustrates an example of a UI/UX screen for management which is provided by the client for external management.

Figure 3:
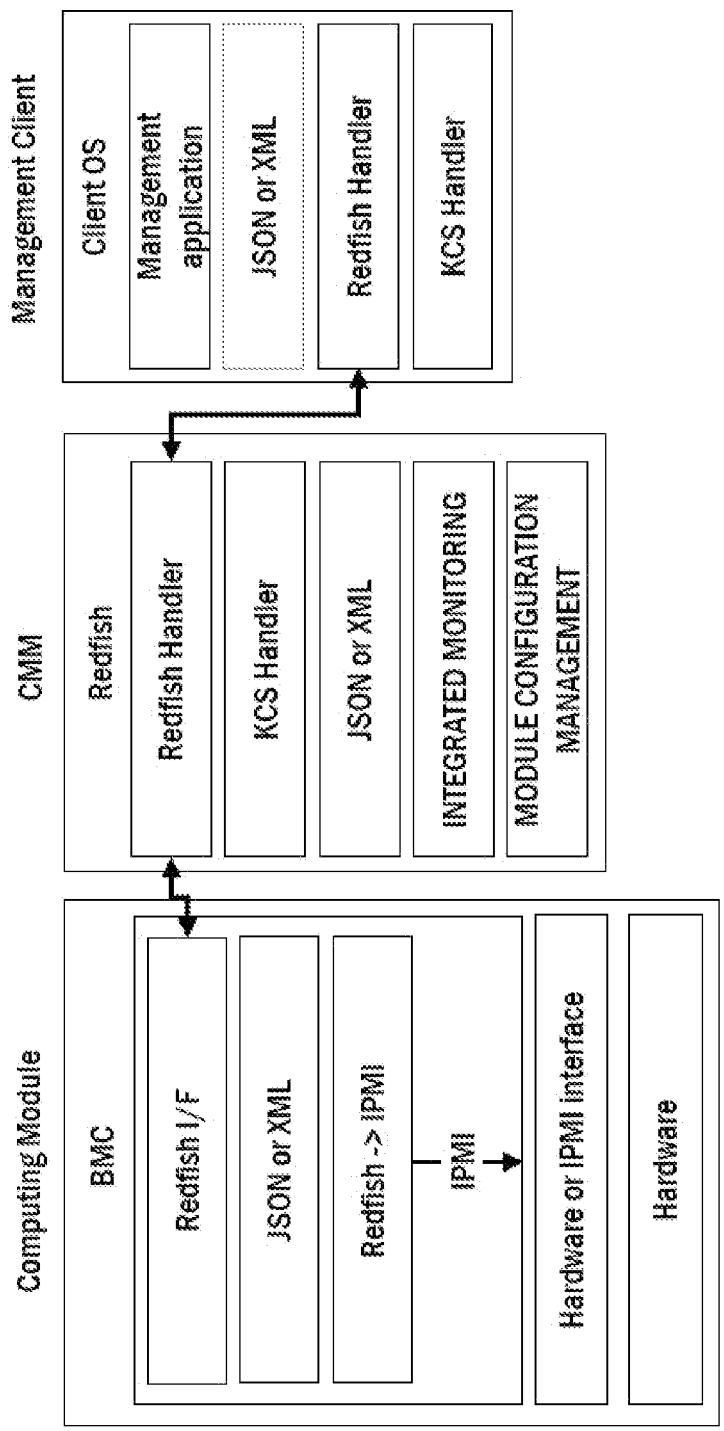
FIG. 3 is a view illustrating a connection structure by a Redfish I/F.

A Redfish I/F may also be applied as an interface for connecting between the client for external management and the chassis manager module 110. FIG. 3 illustrates a connection structure among the computing modules 160, 170, 190, the chassis manager module 110, and the client for external management through the Redfish I/F.

Furthermore, the client for external management may directly access a board management controller (BMC) of the computing module 160, 170, 190 to monitor the computing module 160, 170, 190. In this case, a Redfish I/F may also be applied between the client for external management and the computing module 160, 170, 190.

Figure 4:
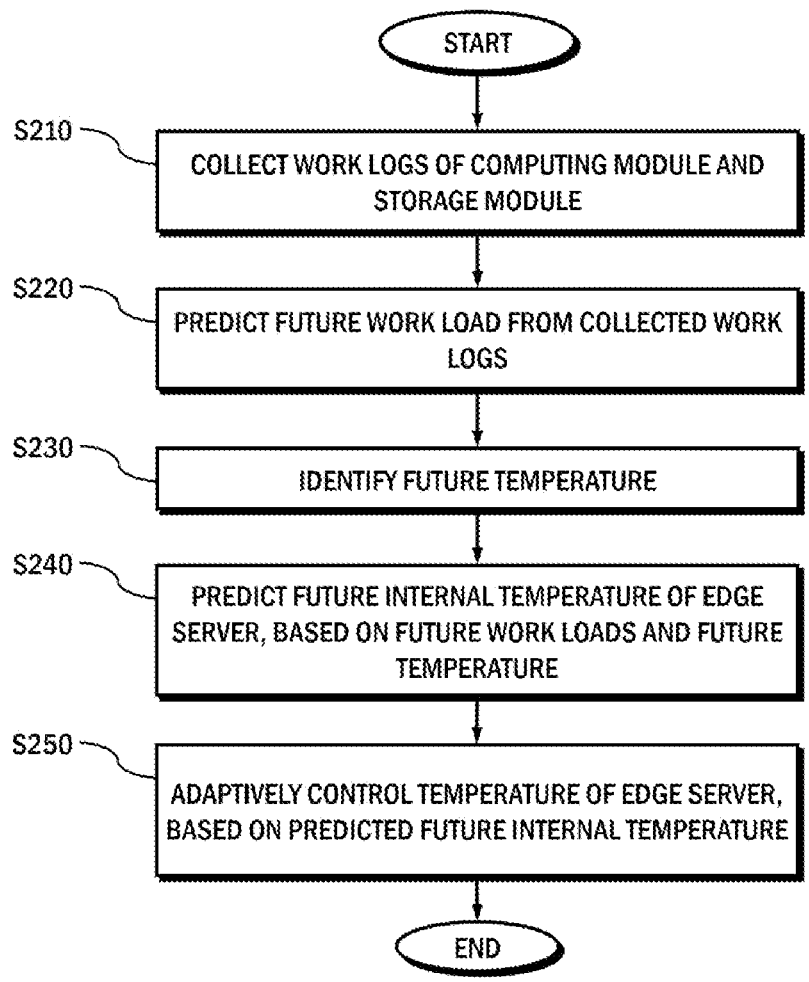
FIG. 4 is a flowchart provided to explain an adaptive temperature control method based on work log analysis according to another embodiment of the disclosure.

FIG. 4 is a flowchart provided to explain an adaptive temperature control method based on work log analysis according to another embodiment of the disclosure.

In order to adaptively control a temperature of the edge server system, the chassis manager module 110 may collect work logs of the computing modules 160, 170, 190 and the storage module 180, first (S210).

Next, the chassis manager module 110 predicts future work loads of the computing modules 160, 170, 190, and the storage module 180 based on the work logs collected at step S210 (S220). At step S220, the future work load may be predicted based on pattern analysis by utilizing an artificial intelligent (AI) model. The pattern analysis is statistically analyzing a distribution of work loads according to time and modules 160, 170, 180, 190.

The chassis manager module 110 identifies a future temperature (S230). At step S230, the future temperature may be identified with reference to a weather forecast provided by a weather center or a portal server.

Thereafter, the chassis manager module 110 predicts a future internal temperature of the edge server system, based on the future work load predicted at step S220 and the future temperature identified at step S230 (S240).

As the predicted future work load is more and the future temperature is higher, the future internal temperature of the edge server system is predicted to be high. On the other hand, as the future work load is less and the future temperature is lower, the future internal temperature of the edge server system is predicted to be low.

Next, the chassis manager module 110 performs adaptive temperature control by controlling not only the fan module 130 and the heater module 140 of the edge server system but also the computing modules 160, 170, 190 and the storage module 180, based on the future internal temperature predicted at step S240 (S250).

Figure 5:
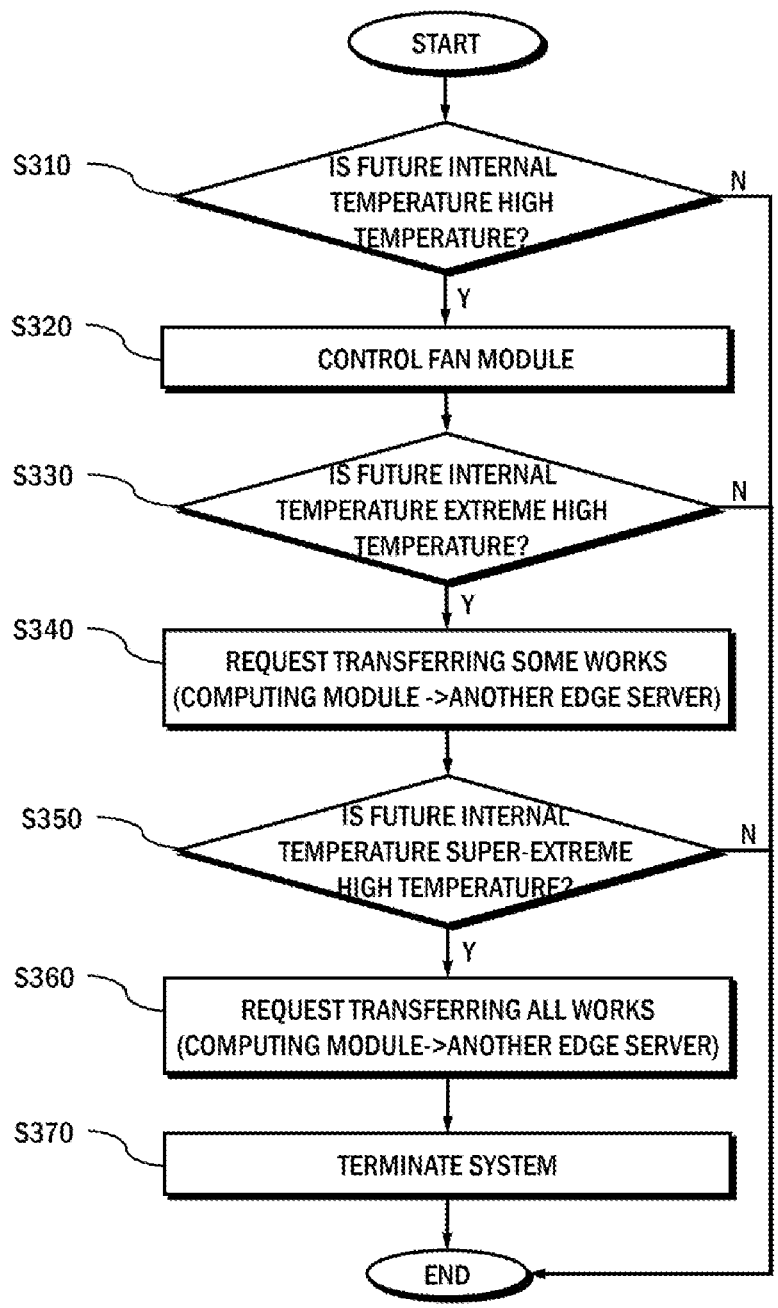
FIG. 5 is a detailed flowchart of step S250 when a future internal temperature is predicted to be high.
Figure 6:
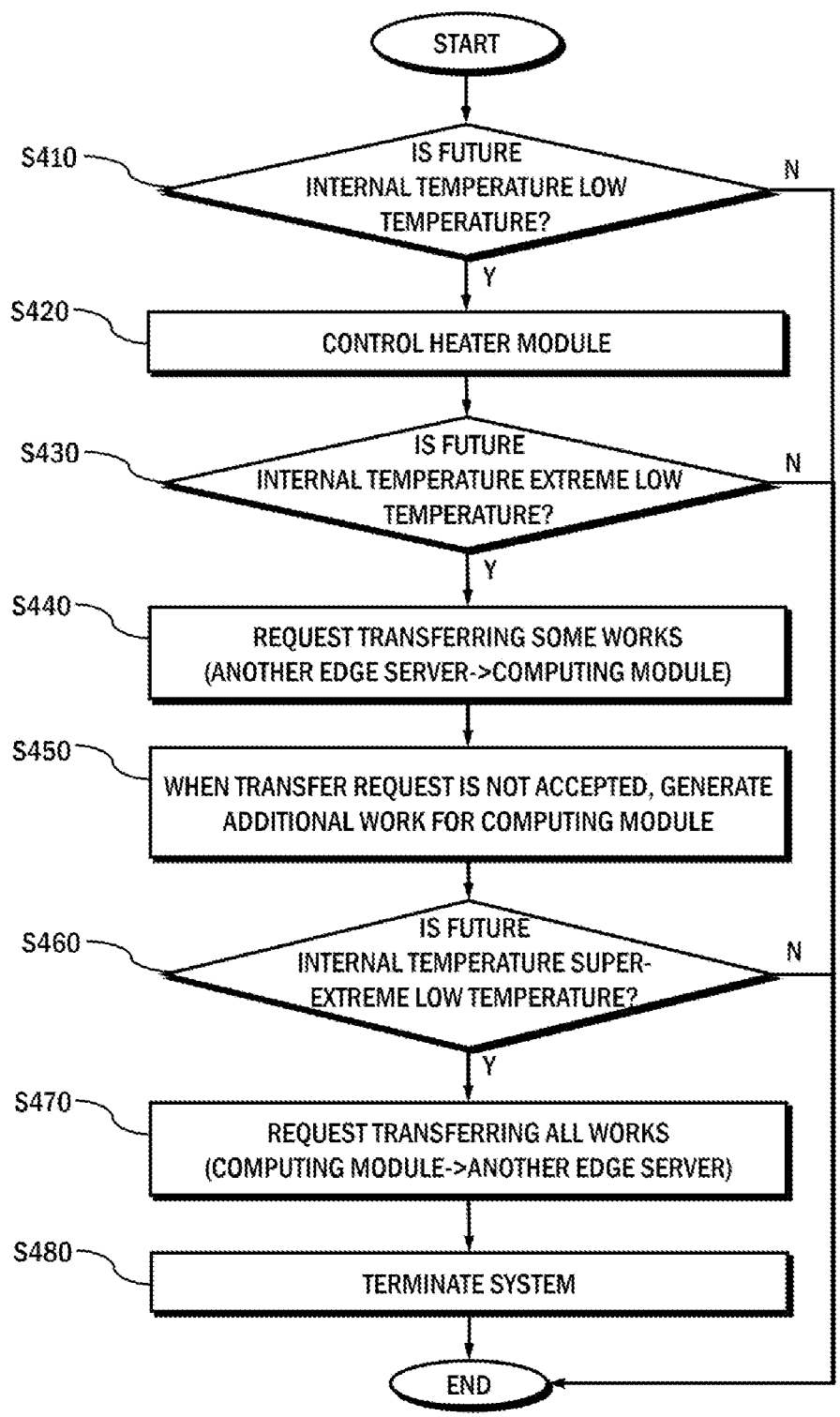
FIG. 6 is a detailed flowchart of step S250 when a future internal temperature is predicted to be low.

Hereinafter, step S250 will be described in detail with reference to FIGS. 5 and 6. FIG. 5 is a detailed flowchart of step S250 when the future internal temperature is predicted to be high, and FIG. 6 is a detailed flowchart of step S250 when the future internal temperature is predicted to be low.

As shown in FIG. 5, when the predicted future internal temperature of the edge server system is a high temperature (S310-Y), the chassis manager module 110 may control the fan module 130 to reduce the internal temperature of the edge server system (S320). The high temperature may be set to any value, and for example, may be set to 40° C. or higher.

When the predicted future internal temperature of the edge server system is an extreme high temperature (S330-Y), the chassis manager module 110 may request transferring some works of the computing modules 160, 170, 190 to another edge sever system (S340). This is to further reduce the internal temperature of the edge server system by reducing the work load. The extreme high temperature may be set to any value, and for example, may be set to 50° C. or higher.

Furthermore, when the predicted future internal temperature of the edge server system is a super-extreme high temperature (S350-Y), the chassis manager module 110 may request transferring all of the works of the computing modules 160, 170, 190 to another edge server system (S360), and may control the power module 120 to terminate the edge server system (S370). This is to protect the edge server system and to prevent interruption of a service. The super-extreme high temperature may be set to 60° C. or higher, for example.

On the other hand, when the predicted future internal temperature of the edge server system is a low temperature (S410-Y) as shown in FIG. 6, the chassis manager module 110 may control the heater module 140 to increase the internal temperature of the edge server system (S420). The low temperature may be set to any value, and for example, may be set to 0° C. or lower.

When the predicted future internal temperature of the edge server system is an extreme low temperature (S263-Y), the chassis manager module 110 may request transferring works from another edge server system to the computing modules 160, 170, 190 (S430). This is to further increase the internal temperature of the edge server system by increasing the work loads of the computing modules 160, 170, 190. The extreme low temperature may be set to any value, and for example, may be set to −10° C. or lower.

When another edge server system refuses to transfer works at step S430, the chassis manager module 110 may generate a certain additional work for the computing modules 160, 170, 190 (S450). The additional work at step S450 may correspond to a work for heating, not a work for performing a service.

Furthermore, when the predicted future internal temperature of the edge server system is a super-extreme low temperature (S460-Y), the chassis manager module 110 may request transferring all of the works of the computing modules 160, 170, 190 to another edge server system (S470), and may control the power module 120 to terminate the edge server system (S480). This is to protect the edge server system and to prevent interruption of a service. The super-extreme low temperature may be set to −20° C. or lower, for example.

Up to now, the adaptive temperature control method based on log analysis of the chassis manager in the edge server has been described in detail with reference to preferred embodiments.

Another edge server system may also request the edge server system according to an embodiment to transfer works in order to control its own temperature. Specifically, anther edge server system may request the edge server system of the disclosure to receive a work or to transfer a work. In any case, the chassis manager module 110 may predict a change in the future internal temperature of the edge server system caused by transfer of a work, and may accept the transfer when the changed future internal temperature as a result of predicting is controllable.

The technical concept of the present disclosure may be applied to a computer-readable recording medium which records a computer program for performing the functions of the apparatus and the method according to the present embodiments. In addition, the technical idea according to various embodiments of the present disclosure may be implemented in the form of a computer readable code recorded on the computer-readable recording medium. The computer-readable recording medium may be any data storage device that can be read by a computer and can store data. For example, the computer-readable recording medium may be a read only memory (ROM), a random access memory (RAM), a CD-ROM, a magnetic tape, a floppy disk, an optical disk, a hard disk drive, or the like. A computer readable code or program that is stored in the computer readable recording medium may be transmitted via a network connected between computers.

In addition, while preferred embodiments of the present disclosure have been illustrated and described, the present disclosure is not limited to the above-described specific embodiments. Various changes can be made by a person skilled in the art without departing from the scope of the present disclosure claimed in claims, and also, changed embodiments should not be understood as being separate from the technical idea or prospect of the present disclosure.

What is claimed is:
1. An adaptive temperature control method of an edge server system, the method comprising:
    collecting, by a chassis manger module of the edge server system, work logs of a computing module and a storage module included in the edge server system;

predicting, by the chassis manager module, a future work load based on a determined pattern from the collected work logs using an AI-based (Artificial Intelligence) prediction model;
identifying, by the chassis manager module, a future temperature;
predicting, by the chassis manager module, a future internal temperature of the edge server system, based on the predicted work load and the identified future temperature; and
controlling, by the chassis manager module, the edge server system, based on the predicted future internal temperature.

2. The method of claim 1, wherein controlling comprises, when the future internal temperature is predicted to be higher than or equal to a first temperature, controlling, by the chassis manager module, a fan module.

3. The method of claim 2, wherein controlling further comprises, when the future internal temperature is predicted to be higher than or equal to a second temperature which is higher than the first temperature, requesting, by the chassis manager module, transferring some works of the computing module to another edge server system.

4. The method of claim 2, wherein controlling further comprises:
when the future internal temperature is predicted to be higher than or equal to a third temperature which is higher than a second temperature which is higher than a first temperature, requesting, by the chassis manager module, transferring all of the works of the computing module to another edge server system; and
controlling, by the chassis manager module, a power module to terminate the edge server system.

5. The method of claim 1, wherein controlling comprises, when the future internal temperature is predicted to be lower than or equal to a fourth temperature, controlling, by the chassis manager module, a heater module.

6. The method of claim 5, wherein controlling further comprises, when the future internal temperature is predicted to be lower than or equal to a fifth temperature which is lower than the fourth temperature, requesting, by the chassis manager module, transferring some works of another edge server system to the computing module.

7. The method of claim 6, wherein controlling further comprises, when the transfer request is not accepted, generating, by the chassis manager module, an additional work for the computing module.

8. The method of claim 6, wherein controlling further comprises:
when the future internal temperature is predicted to be lower than or equal to a sixth temperature which is lower than the fifth temperature, requesting, by the chassis manager module, transferring all of the works of the computing module to another edge server system; and
controlling, by the chassis manager module, a power module to terminate the edge server system.

9. The method of claim 1, wherein controlling further comprises:
when a request to transfer a work is received from another edge server system, predicting, by the chassis manager module, a change in the future internal temperature of the edge server system caused by transfer of the work; and
determining whether to accept the transfer of the work, based on the predicted change in the future internal temperature.

10. An edge server system comprising:
a computing module and a storage module configured to perform works for an edge service;
a fan module configured to reduce an internal temperature of the edge server system;
a heater module configured to increase the internal temperature of the edge server system; and
a chassis manager module configured to collect work logs of the computing module and the storage module, to predict a future work load based on a determined pattern from the collected work logs using an AI-based (Artificial Intelligence) prediction model, to identify a future temperature, to predict a future internal temperature of the edge server system, based on the predicted work load and the identified future temperature, and to control the fan module and the heater module, based on the predicted future internal temperature.

11. An adaptive temperature control method of an edge server system, the method comprising:
predicting, by a chassis manager module of the edge server system installed in a rugged environment, a future internal temperature of the edge server system based on a result of predicting, using an AI-based (Artificial Intelligence) prediction model, a future work load based on a determined pattern from collected work logs; and
controlling, by the chassis manager module, the edge server system, based on the predicted future internal temperature.

12. The system of claim 10, wherein, for the controlling, the chassis manager module is configured to, when the future internal temperature is predicted to be higher than or equal to the first temperature, control a fan module.

13. The system of claim 12, wherein, for the controlling, the chassis manager module is configured to, when the future internal temperature is predicted to be higher than or equal to a second temperature which is higher than the first temperature, transfer some works of the computing module to another edge server system.

14. The system of claim 12, wherein, for the controlling, the chassis manager module configured to:
when the future internal temperature is predicted to be higher than or equal to a third temperature which is higher than the second temperature, transfer all of the works of the computing module to another edge server system; and
control a power module to terminate the edge server system.

15. The system of claim 10, wherein, for the controlling, the chassis manager module configured to, when the future internal temperature is predicted to be lower than or equal to a fourth temperature, control a heater module.

16. The system of claim 15, wherein, for the controlling, the chassis manager module configured to, when the future internal temperature is predicted to be lower than or equal to a fifth temperature which is lower than the fourth temperature, transfer some works of another edge server system to the computing module.

17. The system of claim 16, wherein, for the controlling, the chassis manager module configured to, when the transfer request is not accepted, generate an additional work for the computing module.

18. The system of claim 16, wherein, for the controlling, the chassis manager module configured to:
when the future internal temperature is predicted to be lower than or equal to a sixth temperature which is lower than the fifth temperature, transfer all of the works of the computing module to another edge server system; and control a power module to terminate the edge server system.

19. The method of claim 11, wherein, for the controlling, the chassis manager module configured to:

when a request to transfer a work is received from another edge server system, predict a change in the future internal temperature of the edge server system caused by transfer of the work; and determine whether to accept the transfer of the work, based on the predicted change in the future internal temperature.

* * * * *